United States Patent [19]
Almulla

[11] Patent Number: 5,341,045
[45] Date of Patent: Aug. 23, 1994

[54] PROGRAMMABLE INPUT BUFFER

[75] Inventor: Waleed S. Almulla, Folsom, Calif.

[73] Assignee: Intel Corporation, Santa Clara, Calif.

[21] Appl. No.: 972,971

[22] Filed: Nov. 6, 1992

[51] Int. Cl.$^5$ ............................................ H03K 19/0185
[52] U.S. Cl. .................................. 307/475; 307/443; 307/451
[58] Field of Search ............... 307/451, 475, 264, 469, 307/443, 448

[56] References Cited

U.S. PATENT DOCUMENTS

| | | | |
|---|---|---|---|
| 4,717,836 | 1/1988 | Doyle | 307/450 |
| 4,758,746 | 7/1988 | Birkner et al. | 307/473 |
| 4,929,853 | 5/1990 | Kim et al. | 307/475 |
| 5,097,152 | 3/1992 | Kohda et al. | 307/469 |

Primary Examiner—Edward P. Westin
Assistant Examiner—Jon Santamauro
Attorney, Agent, or Firm—Blakely Sokoloff Taylor & Zafman

[57] ABSTRACT

An input buffer capable of operating at a plurality of power supply levels. The input buffer of the present invention includes input logic that receives the data and has pull-up and pull-down devices that are coupled together in series as an inverter to generate a signal indicative of the data input. The input buffer also includes a mechanism for adjusting the strength of the pull-up and pull-down devices independent of each other so that the trip point and the propagation delay remain the same for the different power supply levels. This allows the input buffer to be CMOS and TTL compatible for all inputs. The input buffer also includes output logic which outputs the data in response to the signal from the input logic.

19 Claims, 3 Drawing Sheets

FIG_1

FIG_2

FIG. 3

FIG_4

PROGRAMMABLE INPUT BUFFER

FIELD OF THE INVENTION

The present invention relates to the field of integrated circuits; particularly, the present invention relates to circuits capable of operating at different power supply levels.

BACKGROUND OF THE INVENTION

Today, certain integrated circuit chips, such as microprocessors, are capable of operating at two different power supply levels. For instance, a chip may be able to operate using either a 3.3 volt or a 5 volt power supply. Furthermore, certain chips in the market today utilize different power supply levels for different portions of the chip. In other words, a portion of the chip may be powered by a power supply at one level (e.g., 5 volt supply), while another portion of the chip is powered by a power supply at a different level (e.g., 3.3 volt supply). Also a portion of the chip may be powered by a power supply at one level (e.g., 3.3 volt supply), while another portion of the chip is capable of operating at numerous power supply levels (e.g., 3.3 volts and 5 volts) at different times.

Integrated circuits are comprised of logic and circuit components. One common circuit or logic component on given integrated circuits is an input buffer. An input buffer allows data or signals off chip to be received as inputs for manipulation and use by the chip. Typically, an input buffer receives the offchip signal or data from a pin which is coupled to a circuit board or other communication means on which the signal is transferred. An input buffer is able to differentiate between a high and low input on the pin by comparing the input to a predetermined threshold value. This predetermined threshold value is referred to as the trip point of the input buffer. If the input data is greater than or has a voltage level above the trip point, then it is considered a high input. However, if the input data is at a level below the trip point, then it is considered a low input by the input buffer.

Prior art input buffers usually have fixed trip points. The trip point is usually fixed according to a ratioed value of its power supply level. Typically, a trip point for a 5 volt supply is set at 1.4 volts. However, the level of the trip point changes with changes in the power supply level. For example, an input buffer having a trip point of 1.4 volts for a 3.3 volt power supply, would have a trip point between 2.2 and 2.3 volts if powered by a 5 volt power supply.

A problem arises when the input buffer is coupled to receive an input from a transistor-transistor logic (TTL). The characteristic input from a TTL circuit typically has a high of approximately 2 volts and a low of approximately 0.8 volts. Prior art input buffers which are TTL compatible have a trip point of approximately 1.4 volts. Thus, in the prior art, an input buffer would be configured to have a 1.4 volt trip point for a fixed power supply voltage level. For example, an input buffer would be configured to operate with a trip point of 1.4 volts when powered by a 3.3 volt power supply. However, if this input buffer is powered by 5 volt power supply then the trip point would be 2.2 to 2.3 volts and would not be able to be tripped by a TTL data input. Therefore, what is needed is an input buffer which can operate at different power supply levels while recognizing both CMOS and TTL inputs.

As will be shown, the present invention comprises an input buffer which is capable of operating at different power supply levels. The input buffer of the present invention is capable of recognizing both CMOS and TTL inputs at the different power supply levels.

SUMMARY OF THE INVENTION

An input buffer capable of operating at a plurality of power supply levels is described. The input buffer of the present invention includes input logic that receives data inputs. The input logic has pull-up and pull-down devices which are coupled together to provide a trip point. The input logic generates a signal indicative of the logic state of the data input. The input buffer also includes a mechanism for adjusting the strength of the pull-up and pull-down devices independent of each other. The adjustments are made according to the power supply level being used so that the trip point remains the same for the different power supply levels. This allows the input buffer to be CMOS and TTL compatible for all inputs. The input buffer also includes output logic which outputs the data inputs in response to the signal from the input logic.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiments, but are for explanation and understanding only.

DETAILED DESCRIPTION OF THE INVENTION

A programmable input buffer is described. In the following description, numerous specific details are set forth, such as specific voltages, transistor sizes, etc., in order to provide a thorough understanding of the preferred embodiment of the present invention. It will be obvious to those skilled in the art that the present invention may be practiced without these specific details. Also, well-known circuits have been shown in block diagram form, rather than in detail, in order to avoid unnecessarily obscuring the present invention.

Figure 1:
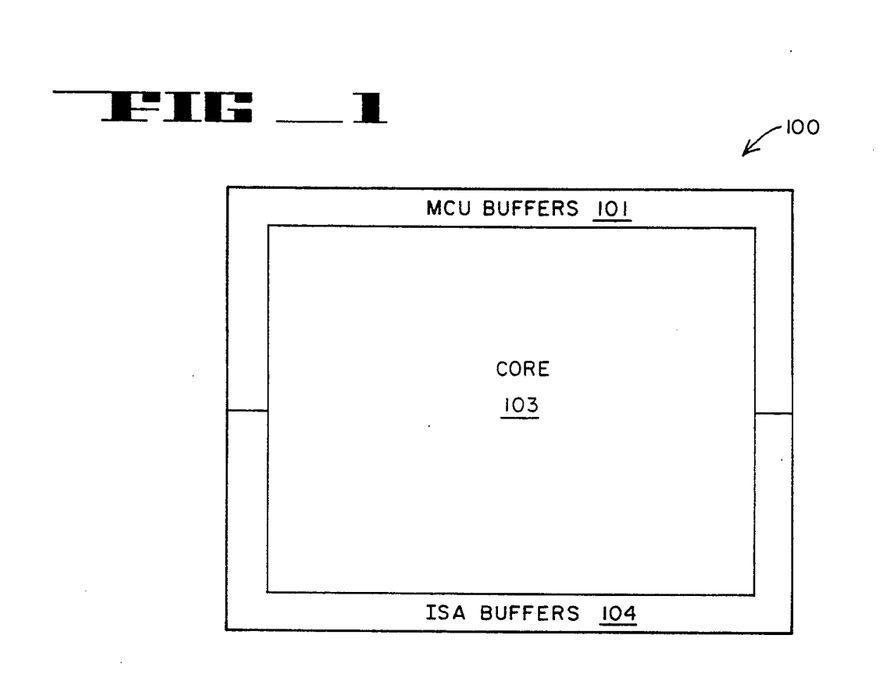
FIG. 1 is a block diagram of the microprocessor of the present invention.

FIG. 1 shows a block diagram of microprocessor 100, utilized by the preferred embodiment of the present invention. Processor 100 is utilized in conjunction with a computer system which generally includes a bus, a main memory, a static memory, a display device, an alphanumeric input device, and a hard copy device (all of which are not shown in order to avoid confusion). Of course, certain computer system implementations and uses of the present invention may not require nor include all of these components.

Processor 100 is preferably manufactured as an integrated circuit using a metal-oxide semiconductor (MOS) process. Referring to FIG. 1, processor 100 generally comprises core unit 103. Core unit 103 include logic and circuitry for processing data, an external bus controller that controls communication of processor 100 with the bus of the computer system, and a memory control unit (MCU) module for controlling communication between processor 100 and the main memory of the computer system. Processor 100 includes MCU buffers 101 for buffering data between the core unit 103 and the memory of the computer system. Processor 100 also includes ISA buffers 104 for buffering communication between core unit 103 and the bus of the computer system. Core 103, MCU buffers 101 and ISA buffers 104 are coupled together using system bus and control signal path (not shown).

In the present invention, core unit 103, MCU buffers 101 and ISA buffers 104 are all powered by individual power supplies. In the currently preferred embodiment core unit 103 is capable of operating at only one power supply level. In the currently preferred embodiment, core unit 103 is powered by a 3.3 volt power supply. In the present invention, MCU buffers 101 and ISA buffers 104 are capable of operating at multiple power supply levels. In the currently preferred embodiment, MCU buffers 101 and ISA buffers 104 are capable of operating with power supply levels of either 3.3 of 5 volts. Thus, it is possible that a module of processor 100 is being powered at 3.3 volts (e.g., core unit 103), while another module (e.g., MCU buffers 101 and/or ISA buffers 104) is operating at 5 volts.

Some of the circuitry in both MCU buffers 101 and ISA buffers 104 must know the level of the power supply which is currently being used to power their operation, e.g., whether it be 3.3 or 5 volts. In the currently preferred embodiment, separate circuitry in both MCU buffers 101 and ISA buffers 104 modules determines the power supply level.

Figure 2:
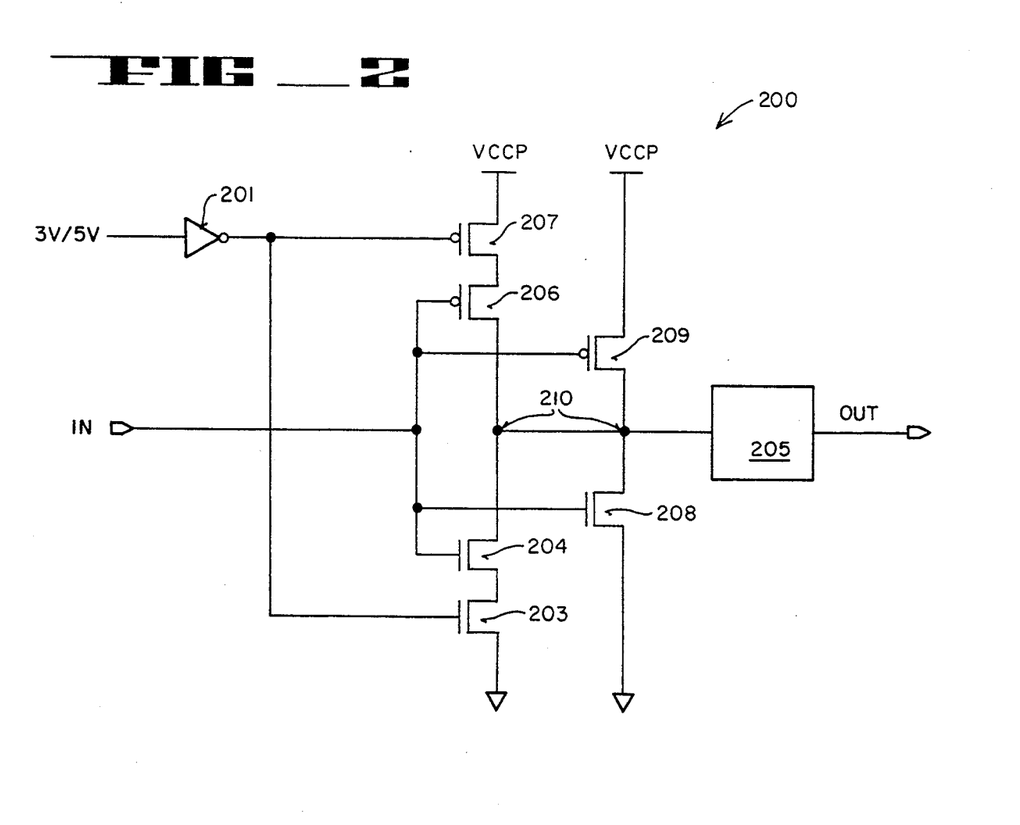
FIG. 2 is a circuit schematic of the input buffer of the present invention.

FIG. 2 illustrates one embodiment of the programmable input buffer of the present invention. The programmable input buffer of the present invention needs to know what the level of the power supply is. Referring to FIG. 2, the power supply level is indicated by the 3 V/5 V signal. In the currently preferred embodiment, the power supply level is either 3.3 or 5 volts. A logical 1 (high) on the 3 V/5 V signal indicates that the 3.3 volt power supply is powering the portion of the chip (e.g., MCU buffers 101 or ISA buffers 104) containing the input buffer, while a logical zero (low) indicates that a 5 volt power supply is being utilized to power the portion of the chip (e.g., MCU buffers 101 or ISA buffers 104). In one embodiment, the 3 V/5 V signal is provided to the input buffer from a configuration register in the module (i.e., MCU or ISA) that owns the input buffer. In another embodiments, the 3 V/5 V signal could come from a power supply level detector on the chip.

Referring to FIG. 2, the programmable input buffer 200 comprises inverter 201, p-channel devices 206, 207 and 209, n-channel devices 203, 204, and 208 and output signal generator 205. The input to inverter 201 is coupled to the 3 V/5 V signal. The output of inverter 201 is coupled to the gate of p-channel device 207 and the gate n-channel device 203. The input IN is coupled to both the gates of p-channel devices 206 and 209 and the gates of n-channel devices 204 and 208. The IN input signal could be a TTL signal range from 0.8 to 2 volts or it could be a CMOS signal. In the present invention, the input IN comes from a pad on the chip.

Devices 203, 204, 206 and 207 are coupled in series between ground ($V_{ss}$) and the power supply level of the core unit (VCCP). Device 207 is sourced by VCCP. The drain of device 207 is coupled to the source of device 206. The drain of device 206 is coupled to the input of output generator 205 at node 210. The drain of device 204 is also coupled to the input of output generator 205 at node 210. The source of device 204 is coupled to the drain of device 203. Device 203 is sourced by ground ($V_{ss}$). Device 209 and 208 are coupled in series between ground ($V_{ss}$) and the power supply level of the unit (VCCP). Device 209 is sourced by the power supply level of the unit (VCCP). The drain of device 209 is coupled to the input of output generator 205 at node 210. Device 208 is sourced by ground ($V_{ss}$). The drain of device 208 is coupled to the input of output generator 205 at node 210. Output generator 205 generates the output OUT of input buffer 200 in response to the output at node 210. It should be noted that each of devices 203, 204, 206, 207, 208 and 209 comprises a MOS transistor in the currently preferred embodiment.

Input buffer 200 uses devices 203–209 as an input stage and output generator 205 as an output stage. Devices 208 and 209 form an inverter, wherein device 208 is used to pull down node 210 and device 209 pulls up node 210. Devices 203, 204, 206 and 207 form adjustable pull up and pull down branches which can be enabled or disabled in such a way that the trip point of the inverter can remain constant for different power supply levels. The adjusting of the pull-up and pull-down keeps the propagation delay the same even if the power supply changes. In the currently preferred embodiment, the trip point is set at 1.4 volts. The pull-up branch is comprised of devices 206 and 207, while the pull-down portion is comprised of devices 203 and 204. Device sizes are chosen such that the strengths of the pull-up and pull-down of the inverter is capable of being adjusted when the power supply level changes. The strengths of the pull-up portion and the pull-down of the inverter portion are adjusted according to the level of the power supply in order to keep the trip point the same for the different power supply levels. Thus, the trip point does not change when the power supply level is changed. In the currently preferred embodiment, the strengths of the pull-up and pull-down portions are adjusted by including or excluding transistors in the operation of input buffer 200. In other words, the pull-up and pull-down portions of input buffer 200 are each made stronger by the addition of extra devices. In this manner, the branches allow for the propagation delay to be kept the same even if the power supply changes.

The determination of whether extra devices are to be added to either the pull-down or pull-up portions is programmed by the 3 V/5 V signal. In the currently preferred embodiment, if input buffer 200 is being powered by a 3.3 volt power supply (i.e., the 3 V/5 V signal is high), then device 207 is on and enables the branch comprised of devices 206 and 207, such that it is included in the pull-up portion of the inverter. In this manner, the strength of the pull-up portion of the inverter is increased. Also, device 203 is off and not conducting current when input buffer 200 is being powered by a 3.3 volt power supply. Therefore, the branch comprised of devices 203 and 204 is disabled. Similarly, in the currently preferred embodiment, if input buffer 200 is being powered by a 5 volt power supply (i.e., the 3 V/5 V signal is low), device 203 is on, thereby enabling the pull-down branch comprised of devices 204 and 203, such that the pull-down branch is included in the pull-down portion. Also, device 207 is off and not conducting current when input buffer 200 is being powered by a 5 volt power supply. Therefore, the branch comprised of devices 206 and 207 is disabled. In this manner, the strength of the pull-down portion is increased, while the strength of the pull-up portion remains the same.

The output of the input stage comprised of devices 203–209 is the inverted data from the IN input. The output stage comprised of output generator 205 receives the output at node 211 (i.e., node 210) and outputs the data in the correct logic level. In other words, output generator 205 inverts the data on its input from the input stage of input buffer 200.

Figure 3:
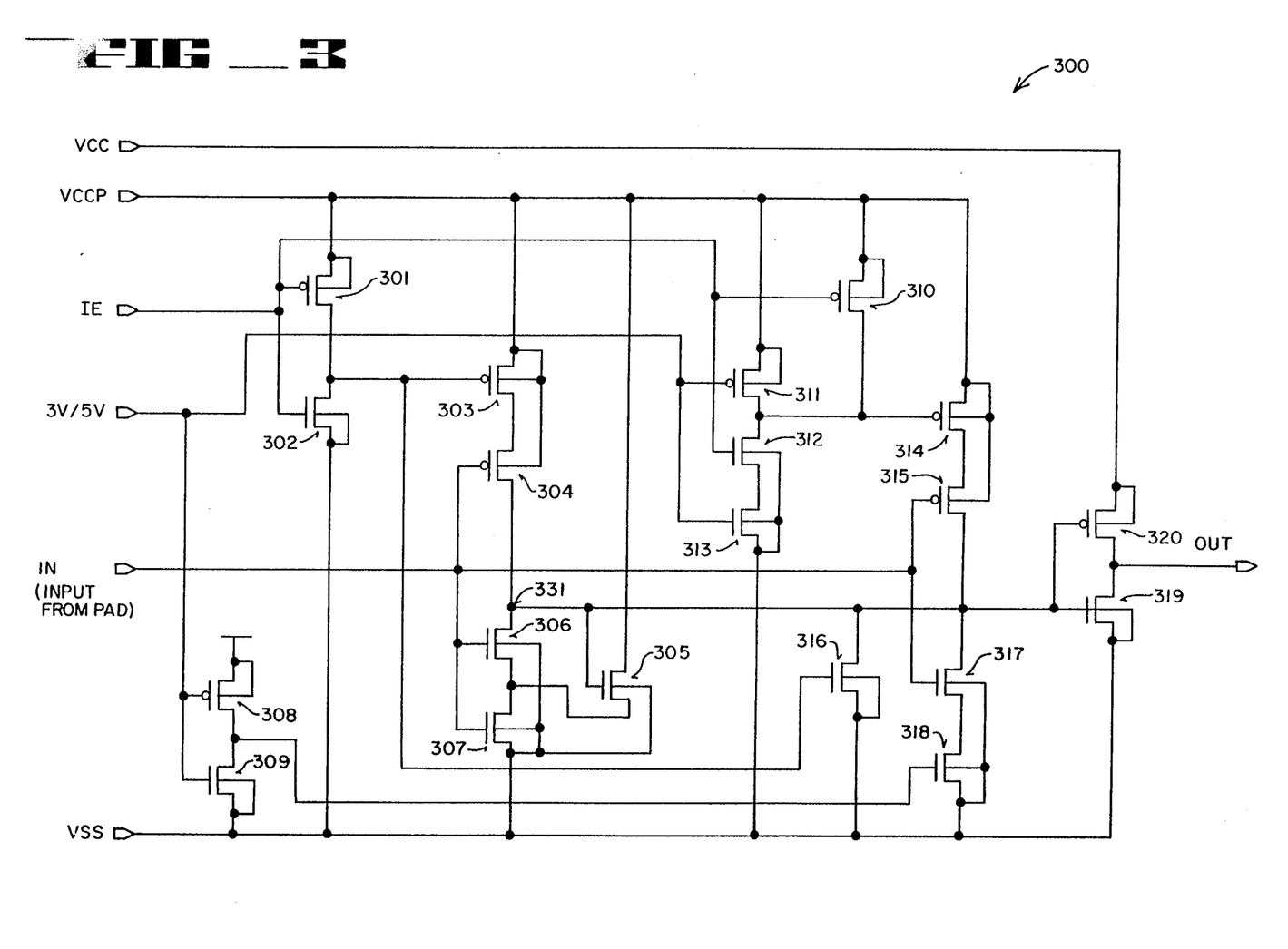
FIG. 3 is the circuit schematic of the currently preferred embodiment of the input buffer of the present invention.

FIG. 3 shows the currently preferred embodiment of the input buffer of the present invention. Referring to FIG. 3, the input buffer 300 comprises p-channel devices 301, 303, 304, 308, 310, 311, 314, 315 and 320 and n-channel devices 302, 305–307, 309, 312, 313, 316–319. In the currently preferred embodiment, all of the devices are MOS transistors. Device 301 is coupled to and sourced by the variable power supply VCCP, such as that which supplies power to the MCU buffers or ISA buffers. The gate of device 301 is coupled to the input buffer enable signal IE. The drain of device 301 is coupled to the drain of device 302. The gate of device 302 is also coupled to the input enable signal IE. The source of device 302 is coupled to ground. Thus, device 301 and 302 form an inverter. In the currently preferred embodiment, each of devices 301 and 302 has a channel length of 0.9μ and channel widths of 9μ and 4μ respectively. The output of the inverter formed by devices 301 and 302 is coupled to the gate of device 303 and the gate of device 316.

Device 303 is coupled to and sourced by the power supply VCCP. The drain of device 303 is coupled to the source of device 304 to which it is coupled to in series. The gate of device 304 is coupled to the data input IN. In the currently preferred embodiment, the data input IN comes from a pad. Note that the data input signal IN is capable of being a TTL signal with a range of 0.8 to 2 volts. The drain of gate 304 is coupled to node 331. Also coupled to node 331 is the drain of device 306. The gate of device 306 is coupled to the data input IN. The source of gate 306 is coupled to the drain of device 307 to which it is coupled in series. The gate of device 307 is coupled to the input IN. Device 307 is coupled to and sourced by ground ($V_{ss}$). The drain of device 307 is also coupled to the drain of device 305. The gate of device 305 is coupled to node 331. Device 305 is coupled to and sourced by the power supply VCCP.

Devices 308 and 309 are coupled in series between VCC and ground ($V_{ss}$). The gates of both devices 309 and 308 are coupled to the power supply indication signal 3 V/5 V. The drains of devices 309 and 308 are coupled to the gate of device 318. Device 308 is sourced by the power supply VCC, while device 309 is coupled to and sourced by ground ($V_{ss}$). Devices 308 and 309 form an inverter, the output of which is coupled to the gate of device 318. In the currently preferred embodiment, devices 308 and 309 have a channel length of 0.911 and have channel widths of 7μ and 3μ respectively.

Device 31 8 is coupled to and sourced by ground ($V_{ss}$), and its drain is coupled to the source of device 317, such that a series coupling is made between devices 310 and 318 and 317. The gate of device 317 is coupled to the input IN, while the drain of device 317 is coupled to node 331. The input data signal IN is coupled to the gate of device 315. The drain of device 315 is coupled to node 331. Device 315 is coupled to and sourced by the drain of device 314 to which it is coupled in series. Device 314 is coupled to and sourced by the power supply VCCP. The gate of device 314 is coupled to the drain of device 310 and the drains of devices 311 and 312. The gate of device 310 is coupled to the input enable signal IE. Device 310 is also coupled to and sourced by the power supply VCCP. Device 311 is coupled to and sourced by the power supply VCCP, and its gate is coupled to the 3 V/5 V power supply indication signal (3 V/5 V). In the currently preferred embodiment, device 311 has a channel width of 6μ and a channel length of 0.9μ. Device 312 is coupled to and sourced by device 313 to which it is coupled in series. The gate of device 312 is coupled to the input enable signal IE. Device 313 is coupled to and sourced by ground ($V_{ss}$) and its gate is coupled to the 3 V/5 V power supply indication signal. In the currently preferred embodiment, device 313 has a channel width of 5μ and a channel length of 0.9μ. Device 310–313 are coupled as a NAND gate with the input buffer enable signal IE and the 3 V/5 V signal as inputs. The output of the NAND gate is coupled to the gate of device 314.

Devices 314, 315, 317 and 318 form the extra pull-up and pull-down branches for the input stage of input buffer 300. Depending on the level of the power supply, either the extra pull-up or extra pull-down branch is added. The extra branch is added to ensure that the trip point and the propagation delay remain the same for the different power supply levels.

The output stage of input buffer 300 comprises devices 319 and 320. Devices 319 and 320 are coupled in series to form an inverter, where device 320 is sourced by the core power supply VCC and device 319 is sourced by ground ($V_{ss}$). The input of the inverter formed by device 319 and 320 (i.e., the gate devices 319 and 320) are coupled to node 331. The output of the inverter formed by devices 319 and 320 is the output of input buffer 300, i.e., the OUT signal. Devices 319 and 320 form the output stage of input buffer 300, while the remainder of input buffer 300 is the input stage. Devices 319 and 320 also form a 5 to 3.3 volt converter when the power supply VCCP is 5 volt.

The operation of input buffer 300 is controlled by the 3 V/5 V signal which indicates whether the module containing input buffer 300 is being powered by 3.3 or 5 volts. In the currently preferred embodiment, when the 3 V/5 V signal is a 1 (high), it indicates that the module is being powered by a 3.3 volt power supply, while when the 3 V/5 V signal is a 0 (low), it indicates that the module is being powered by a 5 volt power supply. In the currently preferred embodiment, the 3V/5V signal is provided to input buffer 300 from a power supply level detector which determines if the power supply voltage is a 3.3 or 5 volt power supply.

The devices of input buffer 300 are sized such that adjustments to the pull-up and pull-down keeps the trip point and the propagation delay the same. In the currently preferred embodiment, the trip point is at 1.4 volts. By programming the pull-down and pull-up in the input stage, the trip point is adjusted to be TTL compatible for each different power supply level. Also, these adjustments keep the propagation delay the same for all of the power supply levels (i.e., 3.3 and 5 volts in the currently preferred embodiment). In other words, the propagation delay is kept the same for each different power supply.

The programming of the pull-down and pull-up stages is accomplished by controlling the addition of either the pull-up branch comprised of p-channel devices 314 and 315 or the pull-down branch comprised of devices 317 and 318. When a 3.3 volt power supply is being used, the pull-up branch of devices 314 and 315 is added to strengthen the pull-up of input buffer 300. When a 5 volt power supply is used, the pull-down branch of devices 317 and 318 is added to strengthen the pull-down of input buffer 300. The addition of the extra p-channel or n-channel devices is controlled by the 3V/5V signal.

In the currently preferred embodiment, devices 314, 315, 317 and 318 have a channel width of 14μ and a channel length of 1.2μ. Devices 306 and 307 have a channel width of 27μ and a channel length of 1.2μ. Devices 303 and 304 have a channel width of 12μ and a channel length of 1.2μ.

Input buffer 300 is also controlled by the input enable signal IE. The input enable signal IE enables input buffer 300. When the input enable signal IE is a 1 (high), devices 302 and 312 are on. When device 302 is on, it causes device 303 to be on, thereby sourcing device 304 with the voltage supply VCCP. When device 312 is on, it allows device 314 to be turned on by device 313 when a 3.3 volt power supply is being used. On the other hand, if the input enable IE is disabled by going low (0), device 310 is turned on causing device 314 to be off due to the 1 (high) on its gate. Furthermore, the input enable IE being low causes device 301 to be on, thereby causing device 316 to be turned on causing node 331 to be pulled to ground. This causes the output OUT of input buffer 300 to be a 1. Thus, when input buffer 300 is disabled, the output OUT of the input buffer is put in a known state (i.e., 1). In the currently preferred embodiment, device 316 has a channel width of 10μ and a channel length of 0.9μ. Also, in the currently preferred embodiment, device 310 has a channel width of 6μ and a channel length of 0.9μ. Furthermore, in the currently preferred embodiment, device 312 has a channel width of 5μ and a channel length of 0.9μ.

Assuming that input buffer 300 is enabled, if the module containing input buffer 300 is being powered by a 3.3 volt power supply, the 3 V/5 V signal will be a 1 (high). When the 3 V/5 V signal is high, the output of the NAND gate formed by devices 310–312 is a 0 (low) which causes the pull-up branch of devices 314 and 315 to be enabled. Similarly, when the 3 V/5 V signal is high, the output of the inverter comprised of devices 308 and 309 is a 0 (low), causing devices 318 to be off, such that no current flows and the pull-down branch formed by devices 317 and 318 is disabled. Therefore, if the data input is a 1, only devices 306 and 307 contribute to the output on node 331, while if the input is a 0, then devices 303, 304, 314 and 315 provide a pull-up on node 331. Thus, the 3 V/5 V signal strengthens the pull-up of the input buffer 300.

Assuming the input buffer 300 is enabled, if the module containing input buffer 310 is being powered by a 5 volt power supply, the 3 V/5 V signal will be a 0 (low). When the 3 V/5 V signal is low, the output of the inverter comprised of devices 308 and 309 outputs a 1 (high) to the gate of device 318, thereby causing the pull-down branch formed by devices 317 and 318 to be enabled. Similarly, when the 3 V/5 V signal is low, the output of the NAND gate formed by devices 310–313 (assuming the enabling signal IE is high), outputs a (high), thereby causing device 314 to be off, such that the pull-up branch of devices 314 and 315 is disabled. Therefore, if the data input is a 0, only devices 303 and 304 are on to pull-up the data input to a 1, such that if the data input IN is a 1, then both devices 306, 307, 317 and 318 pull-down node 331 to a 0. Thus, the 3 V/5 V signal strengthens the pull-down of input buffer 300.

The output stage comprising the inverter of devices 319 and 320 inverts the data on node 331 and outputs the data at either 0 and 3.3 volts. Thus, devices 319 and 320 act as a converter to supply the data, which may be at a different voltage level, at the power supply level of the core, VCC. It should be noted that although the output stage operates at the power supply level of the core, the input stage in the currently preferred embodiment operates using the 3.3 or 5 volt power supply level of the module that owns. Also in the currently preferred embodiment, devices 319 and 320 have a channel length of 0.9μ and channel widths of 23μ and 22μ respectively.

Device 305 is used to add an additional voltage to protect the input buffer 300 from noisy inputs. As shown, device 305 is on when the output at node 331 is high. Since device 305 is sourced by the power supply VCCP, when device 305 is on, device 305 sources device 306. In the currently preferred embodiment, the result is about 50 mv of hysteresis. This hysteresis prevents small fluctuations in the input signal from causing the output node 331 to trip. For noisy inputs, if the output at node 331 is rising slowly and goes down and then back up quickly, the output may trip because of the noise, resulting in the wrong data being output from input buffer 300. The hysteresis from device 305 makes the trip point different between falling and rising so it does not see these slight variations. For instance, when the output at node 331 is rising due to the input falling, devices 306 and 307 would be initially on and would slowly be turning off. However, as node 331 goes high, device 305 turns on, causing device 306 to be sourced by the power supply VCCP. If the input IN fluctuates and goes slightly high for a short time period while it is falling, device 306 would be turned on and the voltage sourced from device 305 would keep node 331 high instead of being pulled to ground immediately. Then when the input IN continued to fall, node 331 would continue being pull-up. In this manner, a small fluctuation does not trip input buffer 300. In the currently preferred embodiment, device 305 has a channel width of 4μ and a channel length of 1.8μ.

Another embodiment of the input buffer of the present invention includes a latch in the input datapath. The latch does not add any additional delay stages in the input datapath. The currently preferred embodiment of the input buffer and latch combination of the present invention is shown in FIG. 4.

Figure 4:
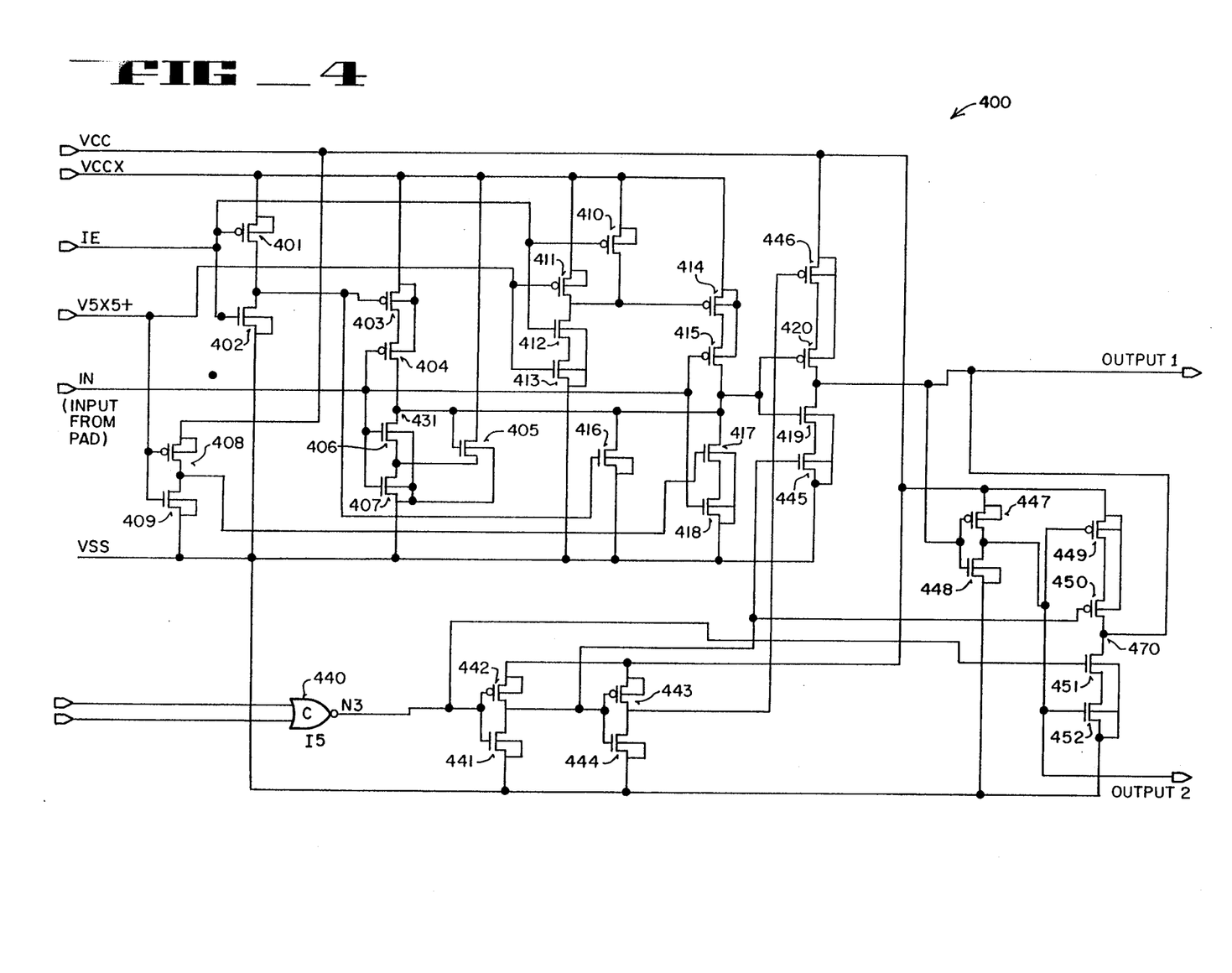
FIG. 4 is the circuit schematic of the input buffer of the present invention with a latch.

Referring to FIG. 4, the input buffer 400 comprises p-channel devices 401, 403, 404, 408, 410, 411, 414, 415, 420, 442, 443, 446, 447, 449 and 450, and n-channel devices 402, 405–407, 409, 412, 413, 416–419, 441, 444, 445, 448, 451 and 452, and NOR gate 440. In the currently preferred embodiment, all of the devices are MOS transistors. Device 401 is coupled to and sourced by the power supply of the VCCP, such as that which powers the MCU buffers or the ISA buffers. The gate of device 401 is coupled to the input buffer enable signal IE. The drain of device 401 is coupled to the drain of device 402. The gate of device 402 is also coupled to the input enable signal IE. The source of device 402 is coupled to ground. Thus, device 401 and 402 form an inverter, the output of which is coupled to the gate of device 403 and the gate of device 416.

Device 403 is coupled to and sourced by the power supply VCCP. The drain of device 403 is coupled to the source of device 404 to which it is coupled to in series. The gate of device 404 is coupled to the data input IN. In the currently preferred embodiment, the data input IN comes from a pad. Note that the data input signal IN is capable of being a TTL signal with a range of 0.8 to 2 volts. The drain of gate 404 is coupled to node 431. Also coupled to node 431 is the drain of device 406. The gate of device 406 is coupled to the data input IN. The source of gate 406 is coupled to the drain of device 407 to which it is coupled in series. The gate of device 407 is coupled to the input IN. Device 407 is coupled to and sourced by ground $V_{ss}$. The drain of device 407 is also coupled to the drain of device 405. The gate of device 405 is coupled to node 431. Device 405 is coupled to and sourced by the power supply VCCP.

Devices 408 and 409 are coupled in series between core power supply VCC and ground $V_{ss}$. The gates of both devices 409 and 408 are coupled to the power supply indication signal 3 V/5 V. The drains of devices 409 and 408 are coupled to the gate of device 417. Device 408 is sourced by the power supply VCC, while device 409 is coupled to and sourced by ground ($V_{ss}$). Devices 408 and 409 form an inverter, the output of which is coupled to the gate of device 417.

Device 418 is sourced by ground ($V_{ss}$), and its drain is coupled to the source of device 417, such that a coupling is made between devices 418 and 417. The gate of device 418 is coupled to the input IN. The drain of device 417 is coupled to node 431. The input data signal IN is coupled to the gate of device 415. The drain of device 415 is coupled to node 431. Device 415 is coupled to and sourced by the drain of device 414 to which it is coupled in series. Device 414 is coupled to and sourced by the power supply VCCP. The gate of device 414 is coupled to the drain of device 410 and the drains of devices 411 and 412. The gate of device 410 is coupled to the input enable signal IE. Device 410 is also coupled to and sourced by the power supply VCCP. Device 411 is coupled to and sourced by the power supply VCCP, and its gate is coupled to the 3 V/5 V power supply indication signal (3V/5V). Device 412 is coupled to and sourced by device 413 to which it is coupled in series. The gate of device 412 is coupled to the input enable signal IE. Device 413 is coupled to and sourced by ground and its gate is coupled to the 3 V/5 V power supply indication signal.

The gates of devices 446 and 445 are coupled to the outputs of two inverters. Device 446 is coupled to and sourced by VCC and its drain is coupled to the source of device 420. Device 445 is coupled to and sourced by ground ($V_{ss}$), and its drain is coupled to the source of 419. Devices 442 and 441 are coupled in series as an inverter where device 442 is coupled to and sourced by VCC and device 441 is coupled to and sourced by ground ($V_{ss}$). The input of the inverter comprised of devices 442 and 441 is coupled to the output of NOR gate 440. The inputs of NOR gate 440 are coupled to a data latch enable signal DLATEN and a mask signal MASK. When the DLATEN and MASK signals are both low, the output of NOR gate 440 is high. The output of NOR gate 440 is also coupled to the gate of device 451. The output of the inverter comprised of devices 442 and 441 is coupled to the input of an inverter comprised of devices 443 and 444 and also coupled to the gate of device 445. Device 443 and 444 are coupled in series, where device 443 is sourced by VCC and device 444 is sourced by ground ($V_{ss}$). The output of the inverter formed by devices 443 and 444 is coupled to gate of device 446. The output of the inverter comprised of devices 442 and 441 is also coupled to the gate of device 450. The output of the inverter comprised of devices 446, 420, 419 and 445 is coupled to one output of input buffer 400, i.e., OUTPUT1, and is also coupled to the input of an inverter comprised of devices 447 and 448. Device 447 is coupled to and sourced by the core power supply VCC while device 448 is coupled to and sourced by ground ($V_{ss}$). The output of the inverter comprised of devices 447 and 448 is coupled to the gate of devices 449 and 452 and is also the second output of input buffer 400, i.e. OUTPUT2. Devices 449–452 form an inverter the output of which is coupled to the output OUTPUT1.

The input buffer portion of buffer 400 comprising devices 401–420 operates in the same manner as that of input buffer 300 in FIG. 3. The latch portion of buffer 400 comprises NOR gate 440 and devices 441–452. When DLATEN is high, indicating that the latch is enabled, or the MASK is high, indicating that the latch is masked, the output of NOR gate 440 is low. When the output of NOR gate 440 is low, device 451 is off and conducts no current. Also, when the output of NOR gate 440 is low, the output of the inverter comprising devices 441 and 442 is high. This output turns on device 445. Also, the output of the inverter comprised of devices 441 and 442 turns off device 450, so no current flows. The output of the inverter comprised of devices 441 and 442 is input to the inverter comprised of devices 443 and 444, which outputs a 0 in response. This 0 output turns on device 446. Thus, when the output of NOR gate 440 is low, the inverter comprising devices 419, 420, 445 and 446 is enabled to output the data input IN, while the inverter comprising devices 449–452 is off. In this instance, the output from the inverter of devices 419, 420, 445, and 446 is output at OUTPUT1 and is input into the inverter comprised of devices 447 and 448. The output of the inverter of devices 447 and 448 is the OUTPUT2 signal.

When the output of NOR gate 440 is a 1, device 451 is on. Also the output of the inverter comprised of devices 441 and 442 outputs a 0, causing device 445 to be off and causing device 450 to be on. The 0 output of the inverter comprised of devices 441 and 442 causes the output of the inverter comprised of devices 443 and 444 to output a 1, causing device 446 to be off. Thus, when the output of NOR gate 440 is a 1, the input buffer is disabled and not read. Depending on what the previous output was from node 460, the inverter comprised of devices 447 and 448 allows the sourcing of node 470. Therefore, if the input of the inverter comprised of devices 447 and 448 is a 1, device 449 turns on and a high is output at node 470 to OUTPUT1. On the other hand, if the input of inverter comprised of devices 447 and 448 is a 0, device 452 turns on, thereby pulling node 470 to ground, and OUTPUT1 is low.

Whereas many alterations and applications of the present invention will no doubt become apparent to a person of ordinary skill in the art after having read the foregoing description, it is understood that the particular embodiment shown and described by illustration is in no way intended to be limiting. Therefore, references to details of the preferred embodiment are not intended to limit the scope of the claims which themselves recite only those features regarded as essential to the invention.

Thus, the programmable input buffer of the present invention has been described.

I claim:

1. An input buffer capable of operating at a plurality of power supply levels in an integrated circuit, said input buffer comprising:
    input means for receiving a data input and generating a signal indicative of the data input, said input means having a means for determining the logic state of the data input, said means for determining having a pull-up means and pull-down means that create a trip point which is responsive to the power supply level,
    wherein the input means also includes a first MOS circuit coupled to the pull-up means, where said first MOS circuit increases the strength of the pull-up means when the input buffer operates at a first of the plurality of power supply levels, and wherein said input means further comprises a second MOS circuit coupled to the pull-down means, where the second MOS circuit increases the strength of the pull-down means when the input buffer operates at a second of the plurality of power supply levels, wherein the power supply levels are changed, the strength of the pull-up and the pull-down means is adjusted such that the trip point remains the same for all power supply levels; and
    output means coupled to said input means for outputting said data input in response to said signal.

2. The input buffer as defined in claim 1 further comprising enabling means for enabling the input buffer in response to an enable signal.

3. The input buffer as defined in claim 2 further comprising means to put the output in a predetermined state when disabled.

4. The input buffer as defined in claim 3 wherein said means to put the output in a predetermined state comprises a transistor.

5. The input buffer as defined in claim 1 wherein said output means outputs the data at one of the plurality of power supply levels.

6. An input buffer capable of operating at a plurality of power supply levels comprising:
    input means for receiving a data input, wherein said input means includes pull-up and pull-down means coupled in series and having a trip point, and further wherein the pull-up and pull-down means generates a signal indicative of the logic state of the data input;
    means for adjusting the pull-up and pull-down means according to the power supply level, such that the trip point remains the same for all power supply levels, wherein the means for adjusting includes a first MOS circuit coupled to the pull-up means, where said first MOS circuit increases the strength of the pull-up means when the input buffer operates at a first of the plurality of power supply levels, and wherein said input means further comprises a second MOS circuit coupled to the pull-down means, where the second MOS circuit increases the strength of the pull-down means when the input buffer operates at a second of the plurality of dower supply levels; and
    output means coupled to said input means for outputting said data input in response to said signal.

7. The input buffer as defined in claim 6 wherein pull-up and pull-down means forms a first inverter.

8. The input buffer as defined in claim 7 wherein said output means comprises a second inverter.

9. The input buffer as defined in claim 6 wherein the input means and means for adjusting operate according to one of the plurality of power supply levels.

10. The input buffer as defined in claim 6 further comprising means coupled to the input means for compensating for fluctuations on the data input, wherein said means for compensating maintains the signal at a first logic state for a predetermined period of time based on the strength of the data input before generating the signal at a second logic state to ensure the data input has changed, such that the trip point is not tripped at the incorrect time.

11. The input buffer as defined in claim 10 wherein said means for compensating comprises a hysteresis device.

12. The input buffer as defined in claim 11 wherein the hysteresis device comprises a transistor device.

13. The input buffer as defined in claim 6 further comprising latching means for the latching the data input from the output means.

14. A processor for use in a computer system, said processor comprising:
    core logic, wherein the core logic processes data;
    a bus controller coupled to the core logic, wherein the bus controller controls communication between the core logic and a bus in the computer system;
    a memory control unit coupled to the core logic, wherein the memory control unit controls communication between the core logic and a memory in the computer system;
    wherein the bus controller includes a first plurality of input buffers, wherein at least one of the first plurality of input buffers includes:
        first input means for receiving a first data input, wherein said first input means includes a first pull-up and a first pull-down means coupled in series and having a trip point, and further wherein the first pull-up and first pull-down means generates a signal indicative of the logic state of the data input;
        first means for adjusting the first pull-up and first pull-down means according to the power supply level, such that the trip point remains the same for all power supply levels, wherein the first means for adjusting comprises two transistor means, one of the two transistor means for increasing the strength of the first pull-up means and the other of the two transistor means for increasing the strength of the first pull-down means; and
        first output means coupled to said first input means for outputting said first data input in response to said first signal.

15. The processor defined in claim 14 wherein the memory control unit includes a second plurality of input buffers, wherein at least one of the second plurality of input buffers includes:
    second input means for receiving a second data input, wherein said second input means includes second pull-up and second pull-down means coupled in series and having a trip point, and further wherein the second pull-up and second pull-down means generates a second signal indicative of the logic state of the second data input;

second means for adjusting the second pull-up and second pull-down means according to the power supply level, such that the trip point remains the same for all power supply levels, wherein the second means for adjusting comprises two transistor means, one of the two transistor means for increasing the strength of the second pull-up means and the other of the two transistor means for increasing the strength of the second pull-down means; and second output means coupled to said second input means for outputting said second data input in response to said second signal.

16. The processor defined in claim 14 further comprising means to put the output in a predetermined state when disabled.

17. The processor defined in claim 14 wherein said output means outputs the data at one of the plurality of power supply levels.

18. The processor defined in claim 14 wherein said input means and means for adjusting operate according to one of the plurality of power supply levels.

19. The processor defined in claim 14 further comprising means coupled to the input means for compensating for fluctuations on the data input, wherein said means for compensating maintains the signal at a first logic state for a predetermined period of time based on the strength of the data input before generating the signal at a second logic state to ensure the data input has changed such that the trip point is not tripped at the incorrect time.

* * * * *